United States Patent
Luo

(10) Patent No.: US 11,980,024 B2
(45) Date of Patent: May 7, 2024

(54) SEMICONDUCTOR STRUCTURE HAVING WORD LINES INTERSECT WITH ACTIVE REGIONS

(71) Applicant: CHANGXIN MEMORY TECHNOLOGIES, INC., Hefei (CN)

(72) Inventor: Qu Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 365 days.

(21) Appl. No.: 17/595,618

(22) PCT Filed: Jun. 9, 2021

(86) PCT No.: PCT/CN2021/099181
§ 371 (c)(1),
(2) Date: Nov. 19, 2021

(87) PCT Pub. No.: WO2022/057332
PCT Pub. Date: Mar. 24, 2022

(65) Prior Publication Data
US 2022/0399345 A1    Dec. 15, 2022

(30) Foreign Application Priority Data
Sep. 15, 2020 (CN) .......................... 202010968812.0

(51) Int. Cl.
*H10B 12/00* (2023.01)
(52) U.S. Cl.
CPC ......... *H10B 12/482* (2023.02); *H10B 12/053* (2023.02); *H10B 12/488* (2023.02)

(58) Field of Classification Search
CPC ... H10B 12/053; H10B 12/482; H10B 12/488
(Continued)

(56) References Cited

U.S. PATENT DOCUMENTS

| 6,103,573 A | 8/2000 | Harari et al. |
| 2010/0120221 A1* | 5/2010 | Kang ................ H01L 29/66666 |
| | | 438/430 |

(Continued)

FOREIGN PATENT DOCUMENTS

| CN | 1684261 A | 10/2005 |
| CN | 108461496 A | 8/2018 |

(Continued)

OTHER PUBLICATIONS

International Search Report as cited in PCT Application No. PCT/CN2021/099181 mailed Sep. 8, 2021, 9 pages.

(Continued)

*Primary Examiner* — Hoai V Pham
(74) *Attorney, Agent, or Firm* — Cooper Legal Group, LLC

(57) ABSTRACT

The present disclosure relates to the field of semiconductor technologies, and provides a semiconductor structure and a method for manufacturing the same. The semiconductor structure includes a semiconductor base, bit lines and word lines, wherein a plurality of active regions is provided in the semiconductor base; the bit lines are disposed in the semiconductor base, extend in a first direction and are connected to the active regions; and the word lines are disposed on the semiconductor base above the bit lines, extend in a second direction, and intersect with the active regions.

9 Claims, 15 Drawing Sheets

(58) Field of Classification Search
USPC .................................... 257/906, 907, 908
See application file for complete search history.

(56) References Cited

U.S. PATENT DOCUMENTS

2013/0026566 A1   1/2013   Kutsukake et al.
2019/0051729 A1   2/2019   Zhou

FOREIGN PATENT DOCUMENTS

| CN | 208336228 U | 1/2019 |
| CN | 109390400 A | 2/2019 |
| CN | 110970436 A | 4/2020 |

OTHER PUBLICATIONS

Written Opinion cited in PCT/CN2021/099181, mailed on Sep. 8, 2021, 6 pages.

\* cited by examiner

SEMICONDUCTOR STRUCTURE HAVING WORD LINES INTERSECT WITH ACTIVE REGIONS

CROSS-REFERENCE TO RELATED APPLICATION

The present disclosure is based on and claims priority to Chinese Patent Application No. 202010968812.0, filed on Sep. 15, 2020 and entitled "SEMICONDUCTOR STRUCTURE AND METHOD FOR MANUFACTURING THE SAME", the entire content of which is herein incorporated by reference in its entirety.

TECHNICAL FIELD

The present disclosure relates to the field of semiconductor technologies, in particular to a semiconductor structure and a method for manufacturing the same.

BACKGROUND

With the continuous increase of integration in semiconductor manufacturing processes, it has become a trend to increase the integration density of a memory.

A dynamic random-access memory (DRAM) is a semiconductor memory that includes an array region composed of a plurality of memory cells and a peripheral region composed of a control circuit. Each memory cell includes a transistor electrically connected to a capacitor, wherein the transistor controls the storage or release of charges in the capacitor to achieve a purpose of storing data. The control circuit may address each memory cell to control data access thereof through word lines (WL) and bit lines (BL) that extend across the array region and are electrically connected to respective memory cells.

In the existing DRAM technology, a buried WL structure is mainly used, accompanied with relatively large cell configuration dimension and limited control ability.

SUMMARY

The present disclosure provides a semiconductor structure and a method for manufacturing the same.

According to a first aspect of the present disclosure, a semiconductor structure is provided. The semiconductor structure includes a semiconductor base in which a plurality of active regions is provided; bit lines which are disposed in the semiconductor base, extend in a first direction and are connected to the active regions; word lines which are disposed on the semiconductor base above the bit lines, extend in a second direction and intersect with the active regions.

According to a second aspect of the present disclosure, a method for manufacturing a semiconductor structure is provided. The method includes: providing a substrate; forming buried bit lines on the substrate, wherein the bit lines extend in a first direction; forming a plurality of active regions on the bit lines, wherein the bit lines are connected to the active regions; and forming word lines above the bit lines, wherein the word lines extend in a second direction and intersect with the active regions.

BRIEF DESCRIPTION OF DRAWINGS

Various objectives, features, and advantages of the present disclosure will become more apparent by considering the following detailed description of the preferred embodiments of the present disclosure in conjunction with the accompanying drawings. The drawings are merely exemplary illustrations of the present disclosure, and are not necessarily drawn to scale. In the drawings, the same reference numerals always refer to the same or similar components. In the drawings.

DESCRIPTION OF EMBODIMENTS

Figure 1:
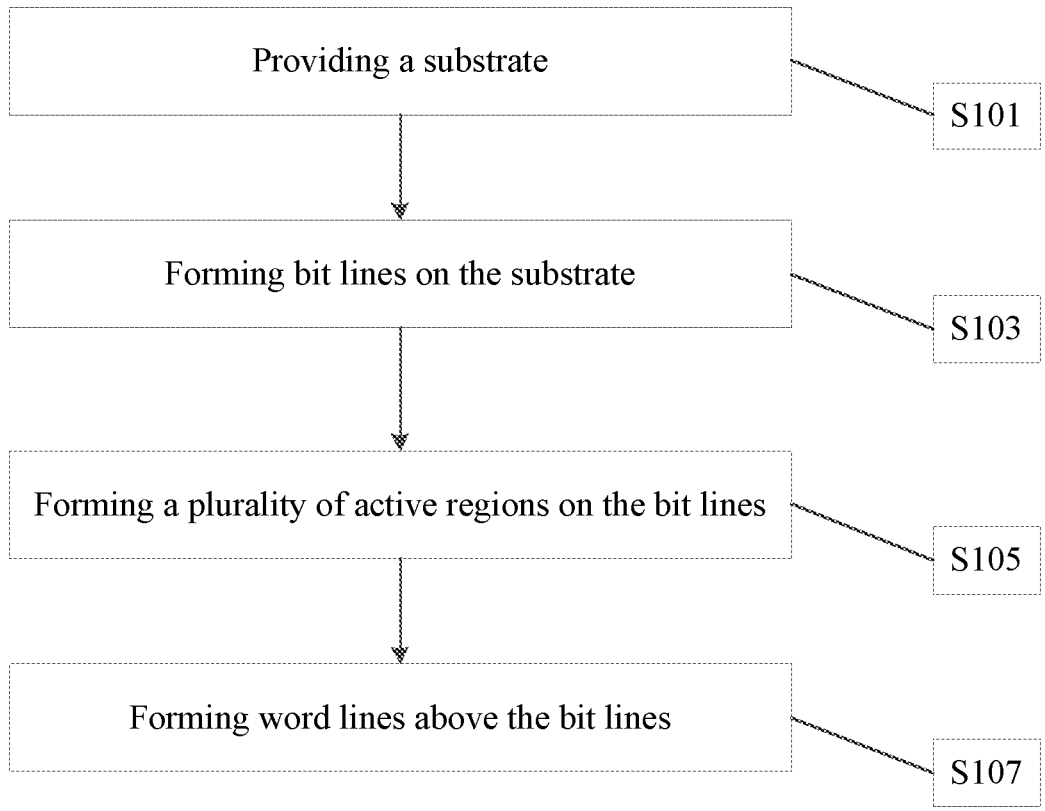
FIG. 1 is a schematic flowchart of a method for manufacturing a semiconductor structure according to an exemplary embodiment.

An embodiment of the present disclosure provides a method for manufacturing a semiconductor structure. Referring to FIG. 1, the method for manufacturing the semiconductor structure includes:

S101, providing a substrate 12;

S103, forming bit lines 20 on the substrate 12, wherein the bit lines 20 extend in a first direction;

S105, forming a plurality of active regions 11 on the bit lines 20, wherein the bit lines 20 are connected to the active regions 11; and S106, forming word lines 30 above the bit lines 20, wherein the word lines 30 extend in a second direction and intersect with the active regions 11.

In the method for manufacturing a semiconductor structure according to the embodiment of the present disclosure, buried bit lines 20 are formed on the substrate 12, and the active regions 11 and the word lines 30 are formed above the bit lines 20, wherein the bit lines 20 are connected to the active regions 11, while the word lines 30 intersect with the active regions 11. Therefore, a cell configuration dimension on the substrate 12 is relatively small, that is, a dimension of the semiconductor structure can be further reduced. In addition, the buried bit lines 20 have a stronger control ability, so as to improve the performances of the semiconductor structure.

It should be noted that a vertical storage transistor is formed in an overlapping region where the bit line 20 and the word line 30 intersect spatially. The vertical storage transistor is disposed on the bit line and connected to the bit line. One overlapping region corresponds to one vertical storage transistor. The vertical storage transistor includes the active regions 11.

In the related art, a width dimension of one memory transistor in a direction perpendicular to the word lines is 3F, a width dimension thereof in a direction perpendicular to the bit lines is 2F, thus an area needed for configuring one memory transistor on the substrate is 6F2 (3F*2F, that is, a 3×2 buried word line structure), wherein F is a minimum feature dimension, that is, a minimum limit line width dimension and a minimum limit line spacing dimension that can be acquired based on a resolution of a current lithography device. The minimum limit line width dimension is equal to the minimum limit line spacing dimension. That is, based on the resolution of an existing lithography device, a cell dimension of the prepared memory transistor can only reach 6F2, and cannot continue to be reduced.

"Cell configuration dimension" refers to a cell configuration dimension needed for configuring one memory cell on the substrate, and specifically includes: a dimension that actually needs to be occupied by one memory cell on the substrate, and a dimension that needs to be reserved for a space between the memory cell and an adjacent memory cell. For example, if the dimension occupied by N memory transistors on the substrate is M, the cell configuration dimension of one memory transistor on the substrate is N/M. For a vertical storage transistor with an upright structure, each word line and the corresponding bit line intersect spatially and have an overlapping region, wherein one overlapping region corresponds to one vertical storage transistor.

In the semiconductor structure manufactured in this embodiment, the bit lines 20 and the word lines 30 each having a minimum feature dimension F can be formed based on relevant manufacturing processes, and a line spacing between every two formed adjacent bit lines 20 and a line spacing between every two formed adjacent word lines 30 are also greater than or equal to the minimum feature dimension F, respectively. Then, a width dimension of one vertical memory transistor in a direction perpendicular to the bit lines is 2F, and a width dimension thereof in a direction perpendicular to the word lines is also 2F. Therefore, the cell configuration dimension of the vertical memory transistor can be correspondingly increased to 4F2 (2F*2F, that is, a 2×2 buried bit line structure). That is, the cell configuration dimension of the vertical memory transistor is greater than or equal to 4 times the square of the minimum feature dimension. Compared with the 3×2 buried word line structure, the 2×2 buried bit line structure has a smaller cell configuration dimension, that is, the packing density is higher.

In one embodiment of the present disclosure, forming the bit lines 20 includes: forming a first insulating dielectric layer 131 on the substrate 12; forming an isolating layer 132 on the first insulating dielectric layer 131; forming a bit line layer 21 on the isolating layer 132; and forming a first opening 22 in the bit line layer 21, wherein the isolating layer 132 is exposed through the first opening 22, and the remaining bit line layer 21 serves as the bit lines 20.

Specifically, the substrate 12 may be formed of a silicon-containing material. The substrate 12 may be formed of any suitable material, for example, including at least one of silicon, monocrystalline silicon, polysilicon, amorphous silicon, silicon germanium, monocrystalline silicon germanium, polysilicon germanium, and carbon-doped silicon.

The first insulating dielectric layer 131 may include silicon dioxide ($SiO_2$), silicon oxycarbide (SiOC) or other materials. The isolating layer 132 may include silicon nitride (SiN), silicon carbonitride (SiCN) or other materials. The isolating layer 132 prevents the metal material included in the bit lines 20 from diffusing into the first insulating dielectric layer 131.

Specifically, each bit line 20 has a laminated structure, which includes a bit line conductive layer, a bit line work function layer, and a bit line contact layer. A material of the bit line conductive layer may include W; a material of the bit line work function layer may include at least one of WSi, TIN, and TI; and a material of the bit line contact layer may include polysilicon. Specifically, each bit line 20 may include titanium nitride (TiN), titanium (Ti), tungsten nitride (WN), tungsten (W), tungsten nitride (WN), tantalum nitride (TaN), tantalum (Ta), titanium silicon nitride compound (TiSiN), tantalum silicon nitride compound (TaSiN), tungsten silicon nitride compound (WSiN), tungsten silicide (WSi), polysilicon or other materials. In one embodiment, as shown in FIG. 2, the bit lines 20 include tungsten (W), tungsten silicide (WSi), titanium nitride (TiN), titanium (Ti), and polysilicon.

It should be noted that the above-mentioned structural layers may be formed by using a physical vapor deposition (PVD) process, a chemical vapor deposition (CVD) process, an atomic layer deposition (ALD) process, a remote plasma nitrodization (RPN), a thermal oxidation process, or the like.

Figure 2:
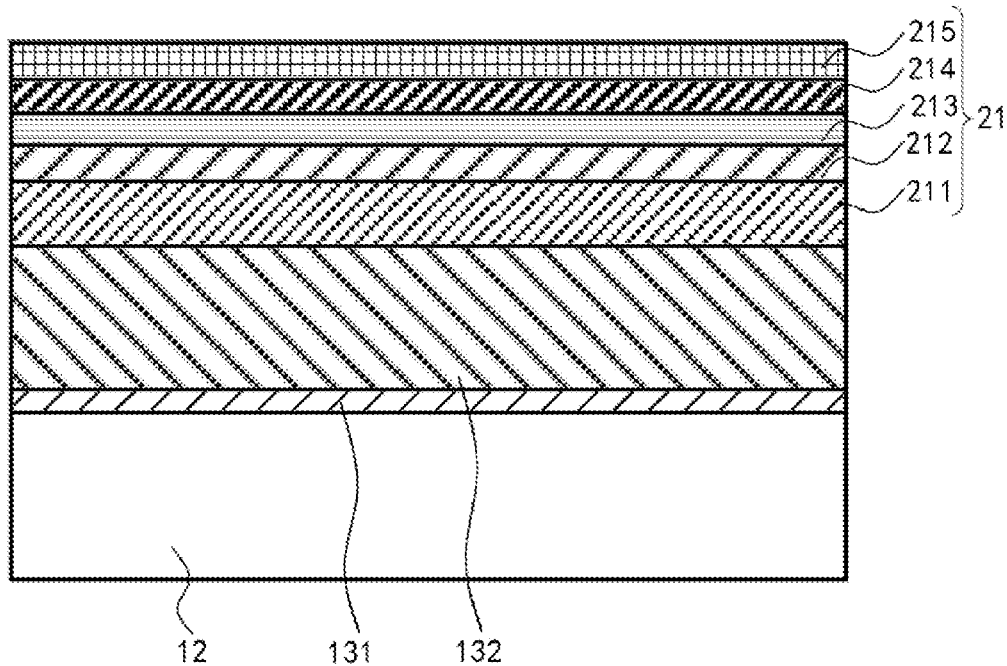
FIG. 2 is a schematic structural diagram of forming a bit line layer in a method for manufacturing a semiconductor structure according to an exemplary embodiment.

In one embodiment, in conjunction with FIG. 2, a first insulating dielectric layer 131, e.g., a SiO2 layer having a thickness of 5 nm, is formed on the substrate 12 through the thermal oxidation process; an isolating layer 132, e.g., a SiN layer having a thickness of 90 nm to 110 nm, is grown after the treatment in a thermal oxidation furnace; a W layer 211 having a thickness of 15 nm to 25 nm is formed by the PVD process; a Wsi layer 212 having a thickness of 1 nm to 3.5 nm is formed by the CVD process; a TIN layer 213 having a thickness of 5 nm to 12 nm is formed by the CVD process; a TI layer 214 having a thickness of 1 nm to 5 nm is formed by the PVD process; and finally, a polysilicon layer 215 having a thickness of 7 nm to 13 nm is grown after the treatment in an oxidation furnace. The W layer 211, the Wsi layer 212, the TIN layer 213, the TI layer 214 and the polysilicon layer 215 serve as the bit line layer 21. Specifically, the W layer 211 serves as a bit line conductive layer; the Wsi layer 212, the TIN layer 213, and the TI layer 214 serve as a bit line work function layer, and the polysilicon layer 215 serves as a bit line contact layer. The polysilicon layer 215 is doped with ions, namely P-type ions and N-type ions; and doping elements may be boron (B), gallium (Ga), phosphorus (P) or arsenic (As). In this embodiment, the polysilicon layer 215 is doped with at least one of boron or gallium.

Figure 3:
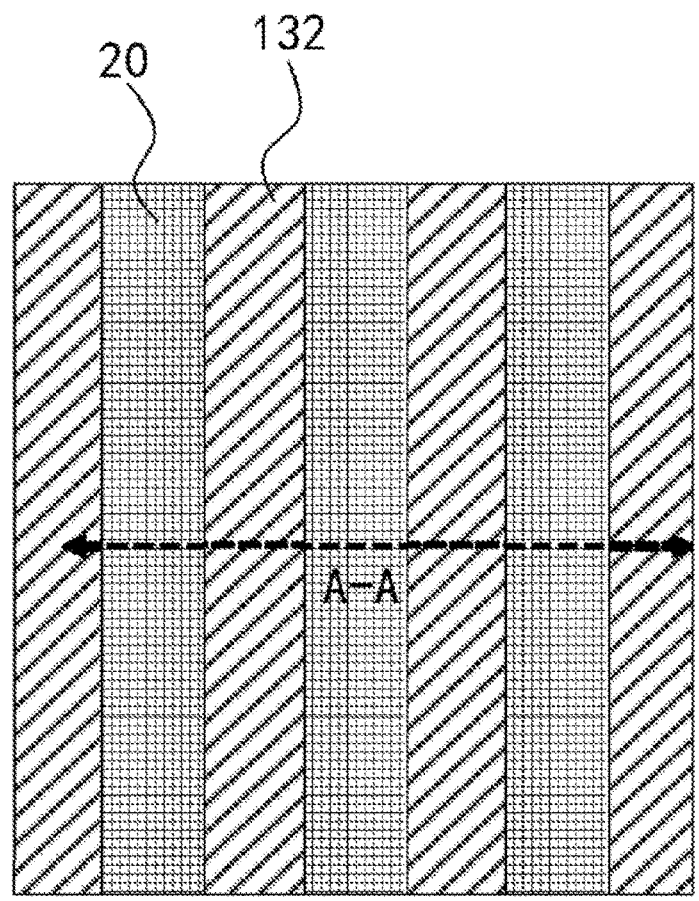
FIG. 3 is a schematic structural diagram of forming bit lines in a method for manufacturing a semiconductor structure according to an exemplary embodiment.
Figure 4:
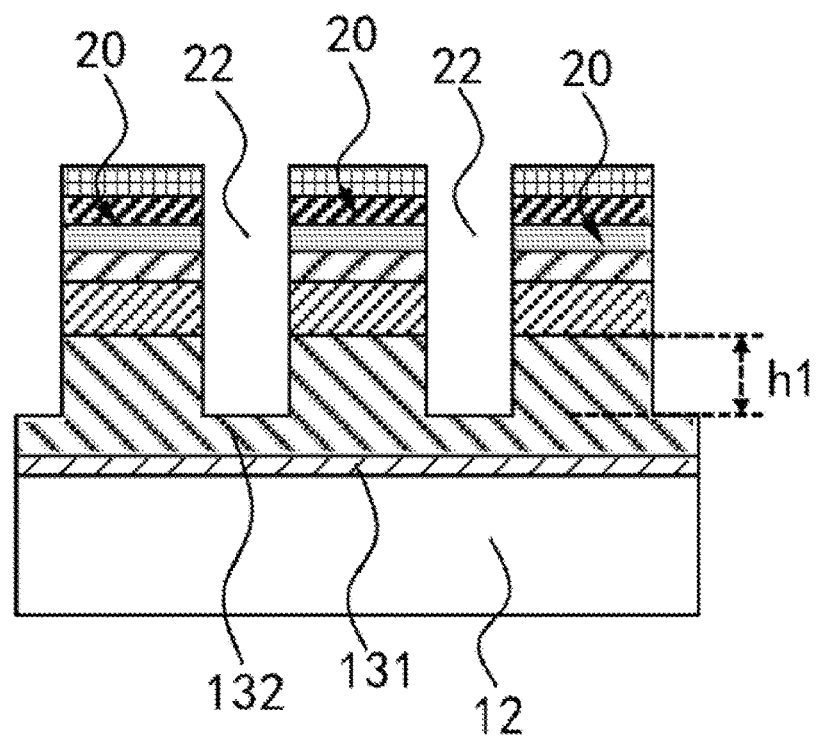
FIG. 4 is a schematic structural diagram of a section at A-A in FIG. 3.

Based on FIG. 2, a first opening 22 is formed by a pattern transfer process such as etching. As shown in FIG. 3 and FIG. 4, the remaining bit line layer 21 serves as the bit lines 20, and in this case, a plurality of bit lines 20 are formed at intervals.

In one embodiment, as shown in FIG. 4, the first opening 22 extends into an isolating layer 132, with a depth h1 inside the isolating layer 132 being 10 nm to 20 nm.

In one embodiment, a method for manufacturing a semiconductor structure further includes: prior to forming a plurality of active regions 11, forming a bit line isolating layer 134 on the isolating layer 132, wherein the bit line isolating layer 134 covers a sidewall and a top end of each bit line 20; forming a second insulating dielectric layer 133 on the bit line isolating layer 134, wherein the second insulating dielectric layer 133 fills the first opening 22 and covers a top end of the bit line isolating layer 134; and forming holes 23 in the second insulating dielectric layer 133, and exposing the bit lines 20 through the holes 23.

Specifically, the bit line isolating layer 134 may include SiN, silicon carbonitride SiCN or other materials. The bit line isolating layer 134 prevents the metal material included in the bit lines 20 from diffusing into the second insulating dielectric layer 133. The second insulating dielectric layer 133 may include SiO2, SiOC or other materials.

It should be noted that the bit line isolating layer 134 and the second insulating dielectric layer 133 may be formed by using a PVD process, a CVD process, an ALD process, or the like.

Figure 5:
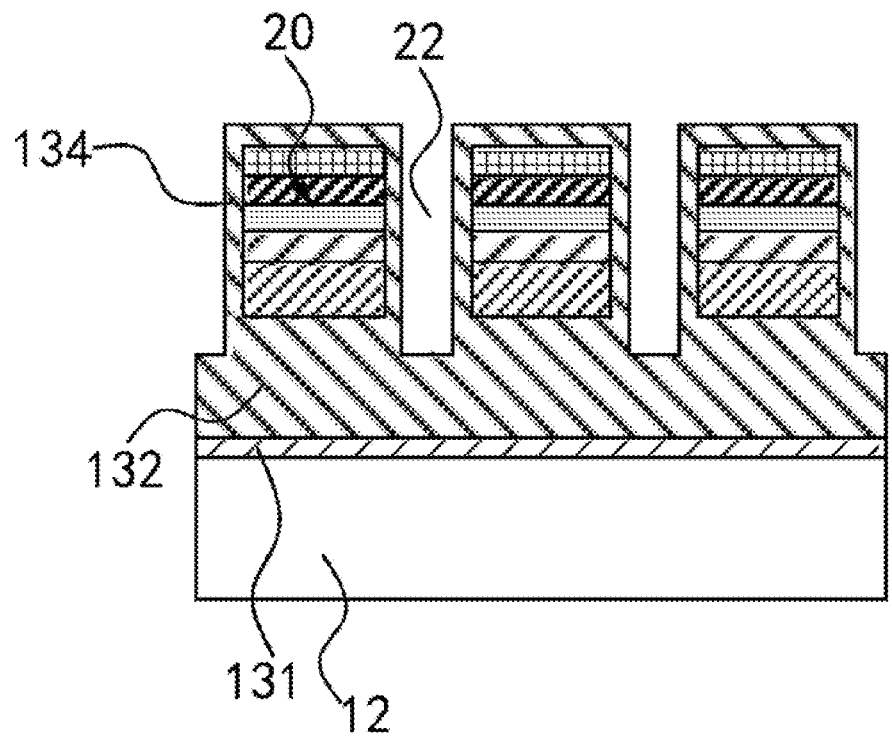
FIG. 5 is a schematic structural diagram of forming a bit line isolating layer in a method for manufacturing a semiconductor structure according to an exemplary embodiment.
Figure 6:
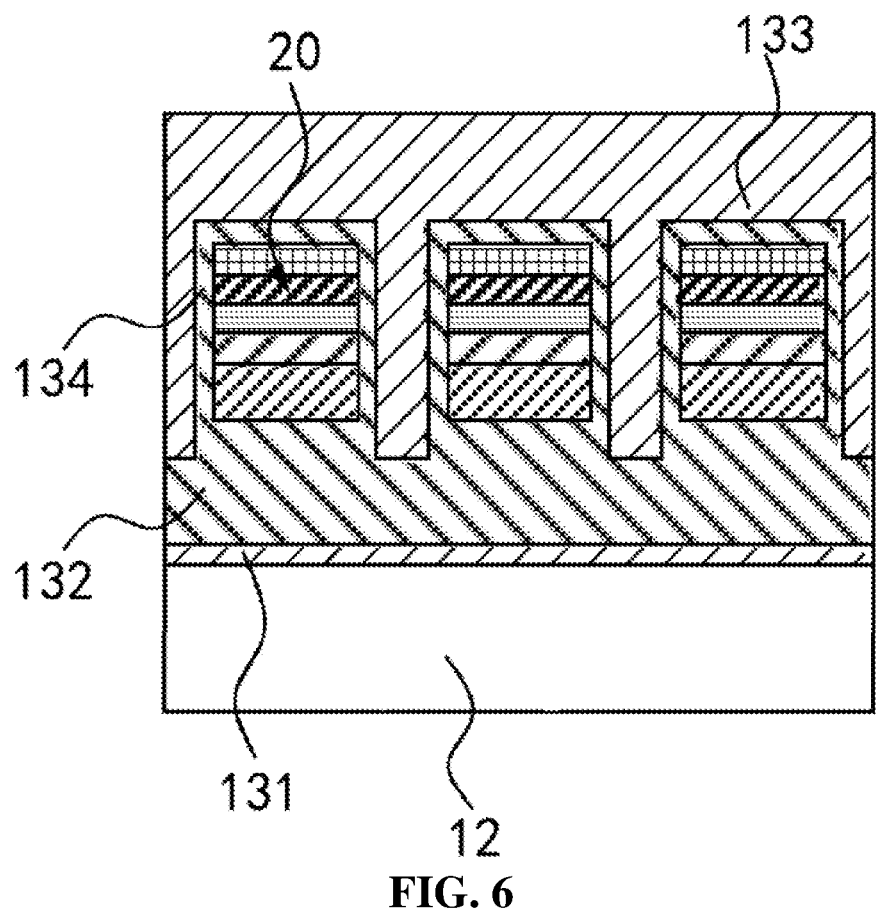
FIG. 6 is a schematic structural diagram of forming a second insulating dielectric layer in a method for manufacturing a semiconductor structure according to an exemplary embodiment.

In one embodiment, based on FIG. 4, the bit line isolating layer 134, e.g., a SIN layer having a thickness of 2 nm to 3 nm is formed by the ALD process, as shown in FIG. 5. The second insulating dielectric layer 133, e.g., an SiO2 layer, is formed by the CVD process, as shown in FIG. 6. The structure shown in FIG. 7 is formed by performing planarization by means of etching or chemical mechanical polishing (CMP).

In one embodiment, forming the holes 23 includes: forming a first mask layer 24 on the second insulating dielectric layer 133, wherein the first mask layer 24 covers a region where the bit lines 20 are disposed; and forming a mask layer pattern 25 on the first mask layer 24, wherein the mask layer pattern 25 covers a first preset region of each hole 23 and a region outside the first preset region is exposed through the first mask layer 24; and forming the holes 23 in the first preset region through an etching process or a pattern transfer process, wherein, in the second direction, a width of each hole 23 is not greater than a width of each bit line 20.

Figure 7:
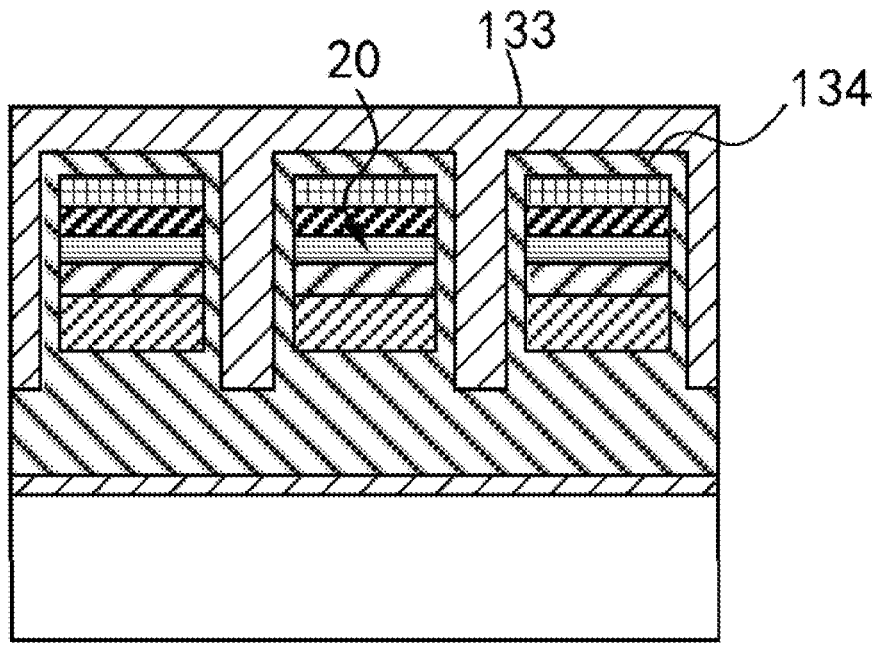
FIG. 7 is a schematic structural diagram of forming a second insulating dielectric layer in a method for manufacturing a semiconductor structure according to another exemplary embodiment.
Figure 8:
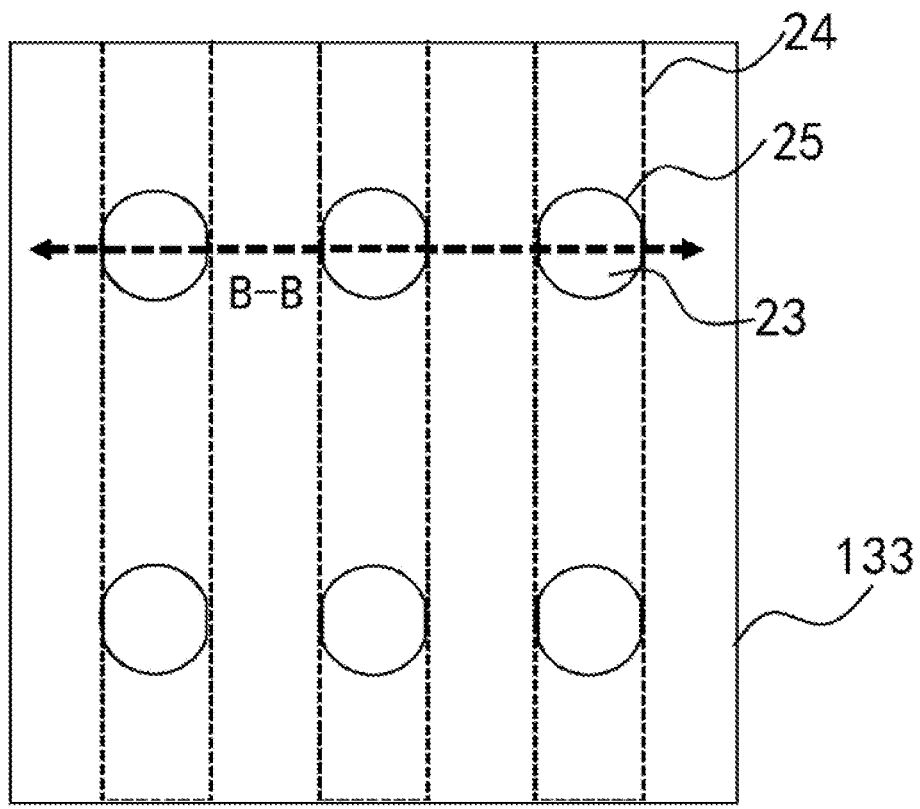
FIG. 8 is a schematic structural diagram of forming a hole in a method for manufacturing a semiconductor structure according to an exemplary embodiment.
Figure 9:
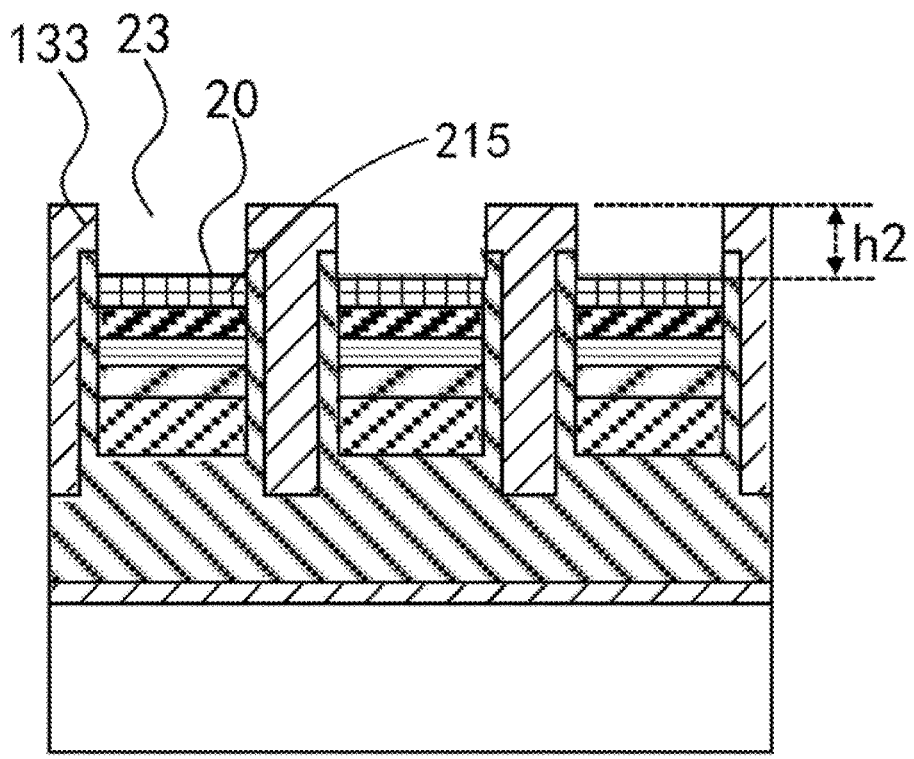
FIG. 9 is a schematic structural diagram of a section at B-B in FIG. 8.

Based on FIG. 7, a plurality of first mask layers 24 is formed on the second insulating dielectric layer 133. That is, the plurality of first mask layers 24 corresponds to the plurality of bit lines 20 one by one. The mask layer pattern 25 is formed on the first mask layers 24, as shown in FIG. 8. The second insulating dielectric layer 133 covered by the mask layer pattern 25 is removed through an etching process or a pattern transfer process to form the holes 23, as shown in FIG. 9. The top end of each bit line 20, i.e., the polysilicon layer 215, is exposed through the corresponding hole 23, wherein a plurality of mask layer patterns 25 may be formed on each first mask layer 24.

In one embodiment, each hole 23 may be a circular or elliptical hole.

In one embodiment, as shown in FIG. 9, a depth h2 of each hole 23 is 20 nm to 40 nm.

In one embodiment, forming the active regions 11 includes: covering the second insulating dielectric layer 133 with an active material layer 26, wherein the holes 23 are filled with the active material layer 26; and forming a second opening 27 in the active material layer 26, and exposing the second insulating dielectric layer 133 through the second opening 27; and forming a third opening 31 in the active material layer 26, wherein the remaining active material layer 26 serves as the active regions 11.

Specifically, the active material layer 26 may be silicon, germanium, or the like, and silicon may be ion-doped.

Figure 10:
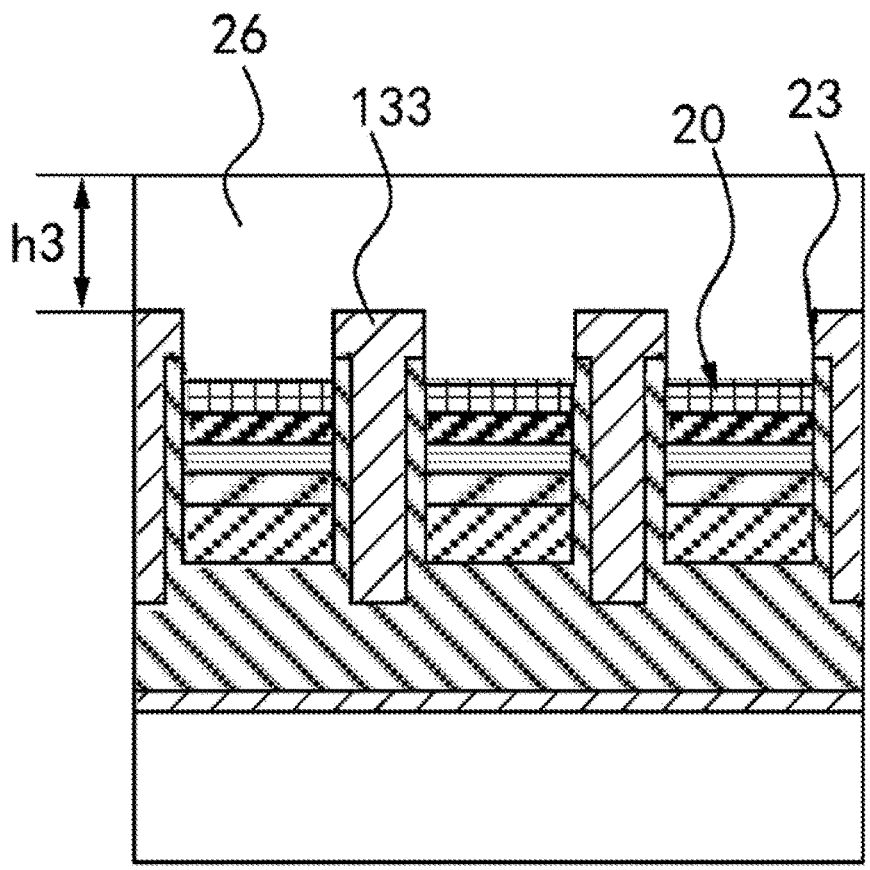
FIG. 10 is a schematic structural diagram of forming an active material layer in a method for manufacturing a semiconductor structure according to an exemplary embodiment.

Based on FIG. 9, the active material layer 26 is formed on the second insulating dielectric layer 133, wherein the active material layer 26 fills the holes 23 and covers an upper surface of the second insulating dielectric layer 133, as shown in FIG. 10.

It should be noted that the active material layer 26 may be formed by using a PVD process, a CVD process, an ALD process, or the like.

In one embodiment, forming the second opening 27 includes: forming a second mask layer 28 on the active material layer 26, wherein the second mask layer 28 extends in a second direction and covers a portion of a second preset region of the second opening 27, and a region outside the second preset region is exposed through the second mask layer 28; forming a third mask layer 29 on the active material layer 26, wherein the third mask layer 29 extends in a third direction and covers a portion of the second preset region, a region outside the second preset region is exposed through the third mask layer 29, and the second mask layer 28 intersects with the third mask layer 29, with a second preset included angle therebetween, the second preset included angle being an acute angle; and forming the second opening 27 in the second preset region by an etching process or a pattern transfer process.

Figure 11:
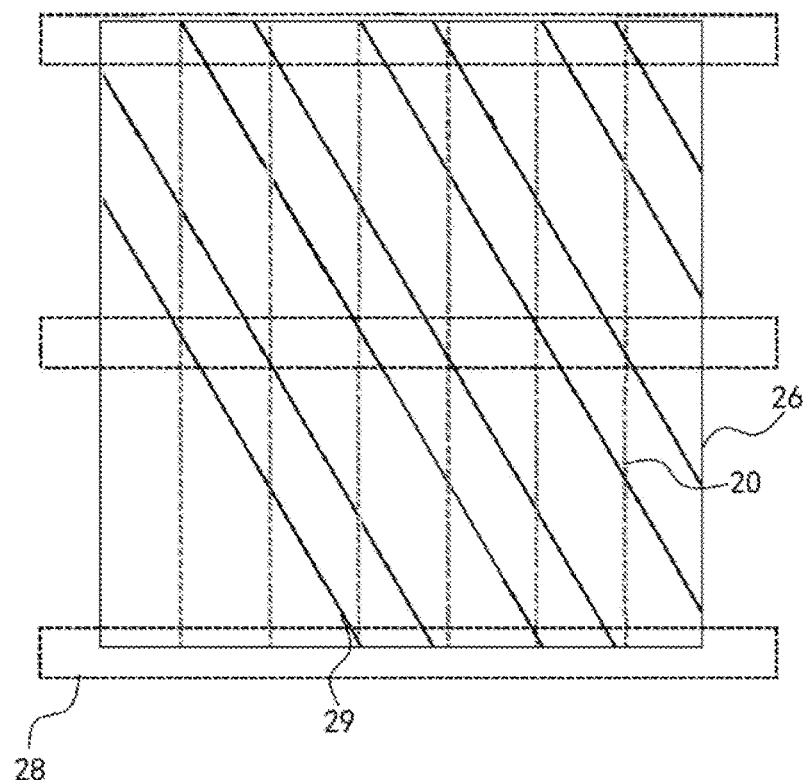
FIG. 11 is a schematic structural diagram of forming a second mask layer and a third mask layer in a method for manufacturing a semiconductor structure according to an exemplary embodiment.
Figure 12:
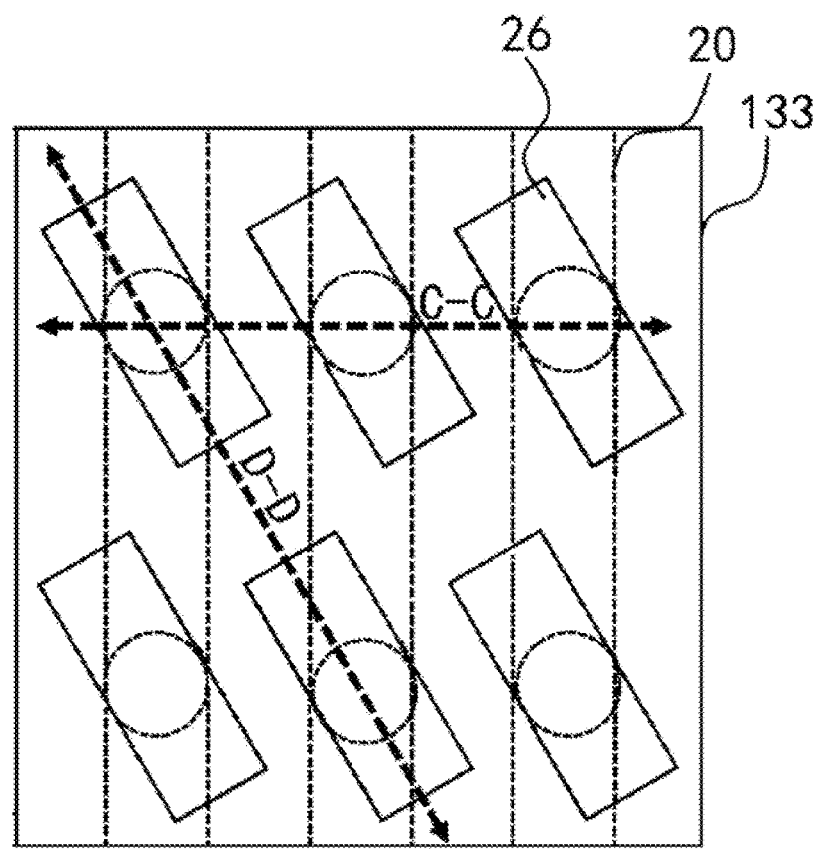
FIG. 12 is a schematic structural diagram after a part of active material layer is removed in a method for manufacturing a semiconductor structure according to an exemplary embodiment.
Figure 13:
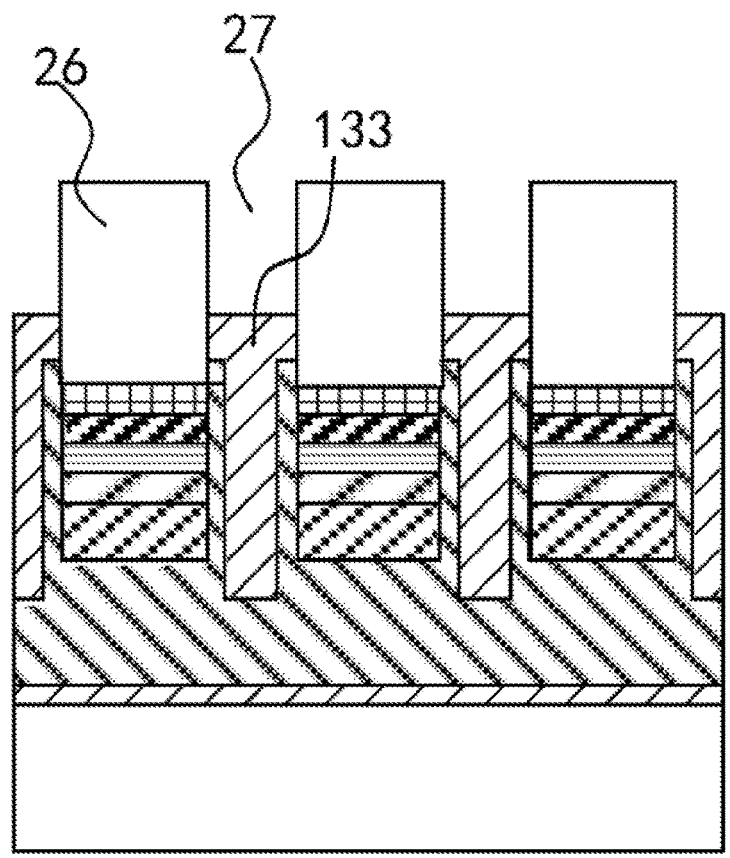
FIG. 13 is a schematic structural diagram of a section at C-C in FIG. 12.

Based on FIG. 10, the second mask layer 28 is formed on the active material layer 26, that is, the plurality of second mask layers 28 is arranged at intervals in the first direction and keeps away from a region where the active regions 11 are disposed, i.e., disposed between end portions of two adjacent active layers 11. Correspondingly, the third mask layer 29 is formed on the active material layer 26, that is, a plurality of third mask layers 29 is arranged at intervals and disposed between side portions of two adjacent active regions 11. That is, the second mask layers 28 and the third mask layers 29 cover a region outside the active regions 11, as shown in FIG. 11. A part of the active material layer 26 is removed by an etching process or a pattern transfer process, thereby acquiring the structure shown in FIGS. 12 to 14. That is, the second opening 27 is formed in the region outside the active regions 11, and in this case, a part of the active material layer 26 is disposed outside the second insulating dielectric layer 133.

It should be noted that the first direction is perpendicular to the second direction, while a second preset included angle between the third direction and the second direction is greater than the first preset included angle between the first direction and the third direction. In this embodiment, the second preset included angle ranges between 40 degrees and 75 degrees.

In one embodiment, as shown in FIG. 10, a distance h3 between a top end of the active material layer 26 and a top end of the second insulating dielectric layer 133 ranges from 80 nm to 120 nm.

In one embodiment, forming the third opening 31 includes: forming a third insulating dielectric layer 135 on the second insulating dielectric layer 133, wherein the third insulating dielectric layer 135 fills the second opening 27 and covers the active material layer 26; forming a fourth mask layer 32 on the third insulating dielectric layer 135, wherein the fourth mask layer 32 extends in the second direction and covers a region outside the a third preset region of the third opening 31; forming the third opening 31 in the third preset region by the etching process or the pattern transfer process, wherein each active region 11 includes a supporting section 111 and two plunger sections 112 disposed in pairs on the supporting section 111, the two plunger sections 112 in one pair intersect with two adjacent word lines 30 respectively, and the supporting section 111 is buried in the third insulating dielectric layer 135.

Specifically, the third insulating dielectric layer 135 may include SiO2, SiOC or other materials.

Figure 14:
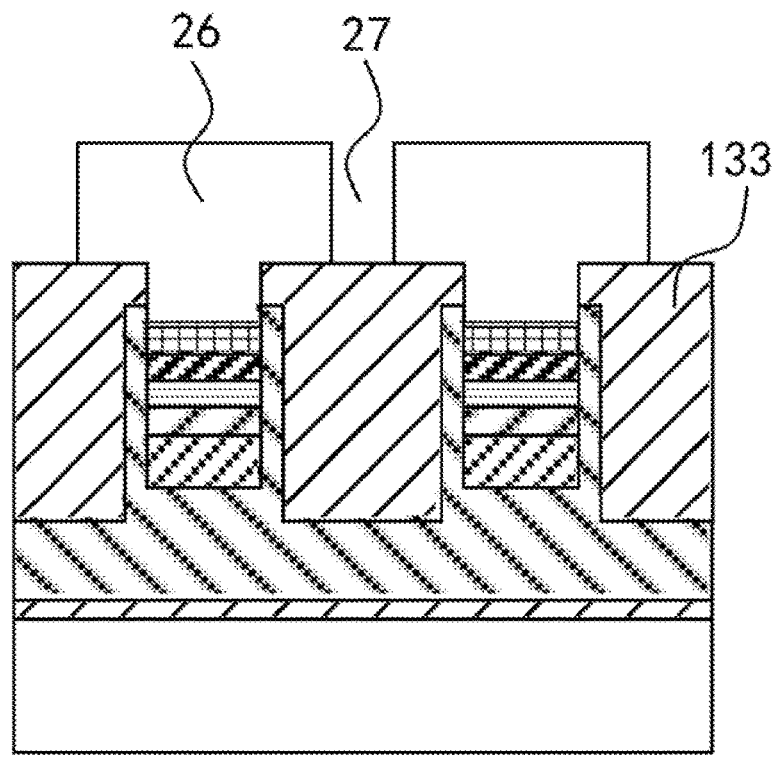
FIG. 14 is a schematic structural diagram of a section at D-D in FIG. 12.
Figure 15:
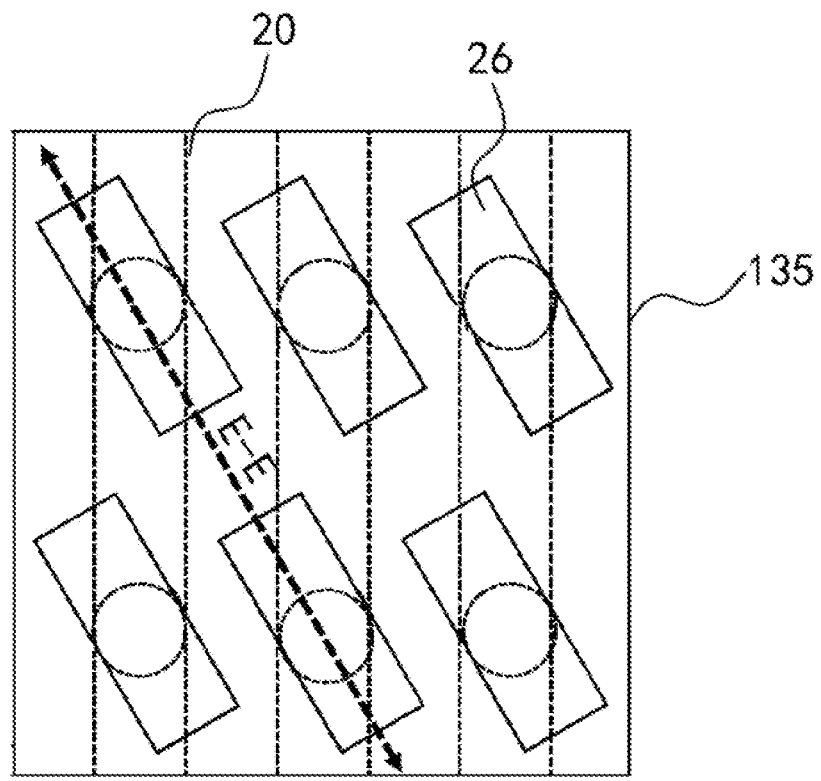
FIG. 15 is a schematic structural diagram of forming a third insulating dielectric layer in a method for manufacturing a semiconductor structure according to an exemplary embodiment.
Figure 16:
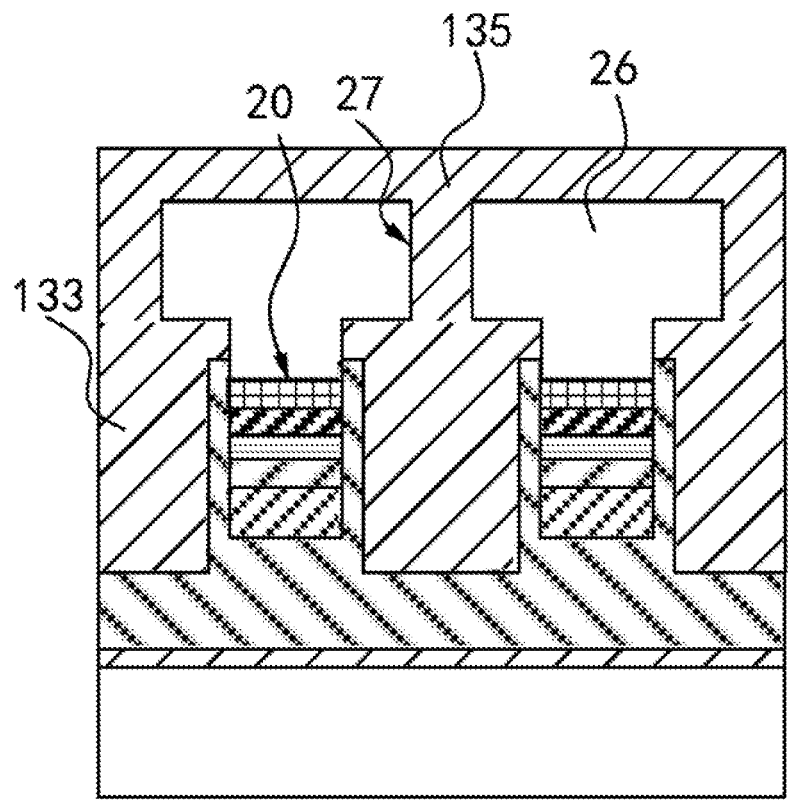
FIG. 16 is a schematic structural diagram of a section at E-E in FIG. 15.

Based on FIG. 14, the third insulating dielectric layer 135 is formed on the second insulating dielectric layer 133, and the third insulating dielectric layer 135 completely covers the active material layer 26. That is, the active material layer 26 is buried in the second insulating dielectric layer 133 and the third insulating dielectric layer 135, as shown in FIG. 15 and FIG. 16.

It should be noted that the second insulating dielectric layer 133 may be formed by using a PVD process, a CVD process, an ALD process, or the like.

Figure 17:
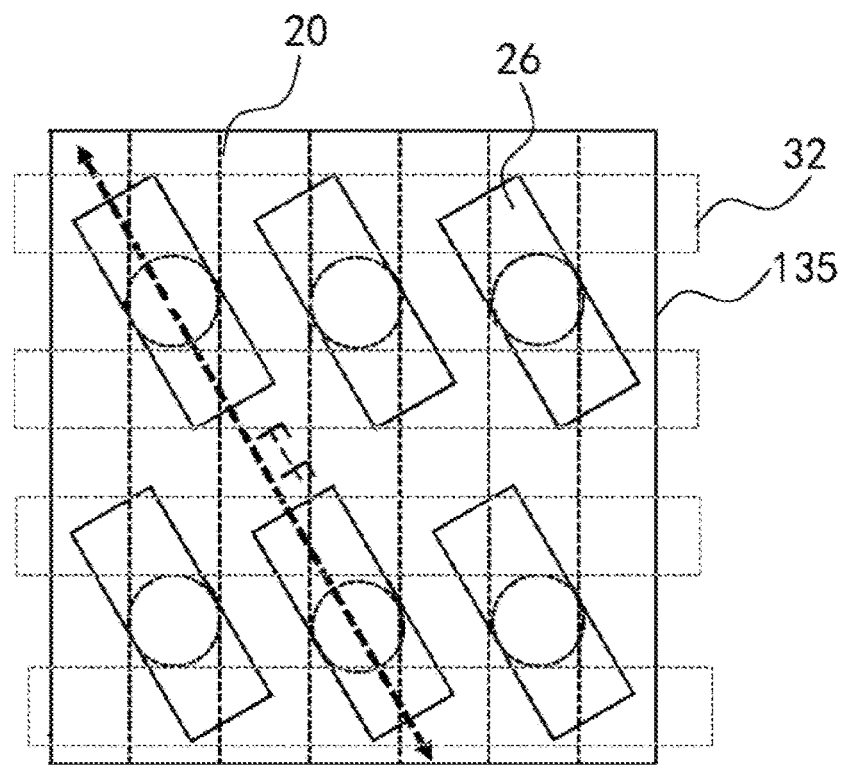
FIG. 17 is a schematic structural diagram of forming a fourth mask layer in a method for manufacturing a semiconductor structure according to an exemplary embodiment.
Figure 18:
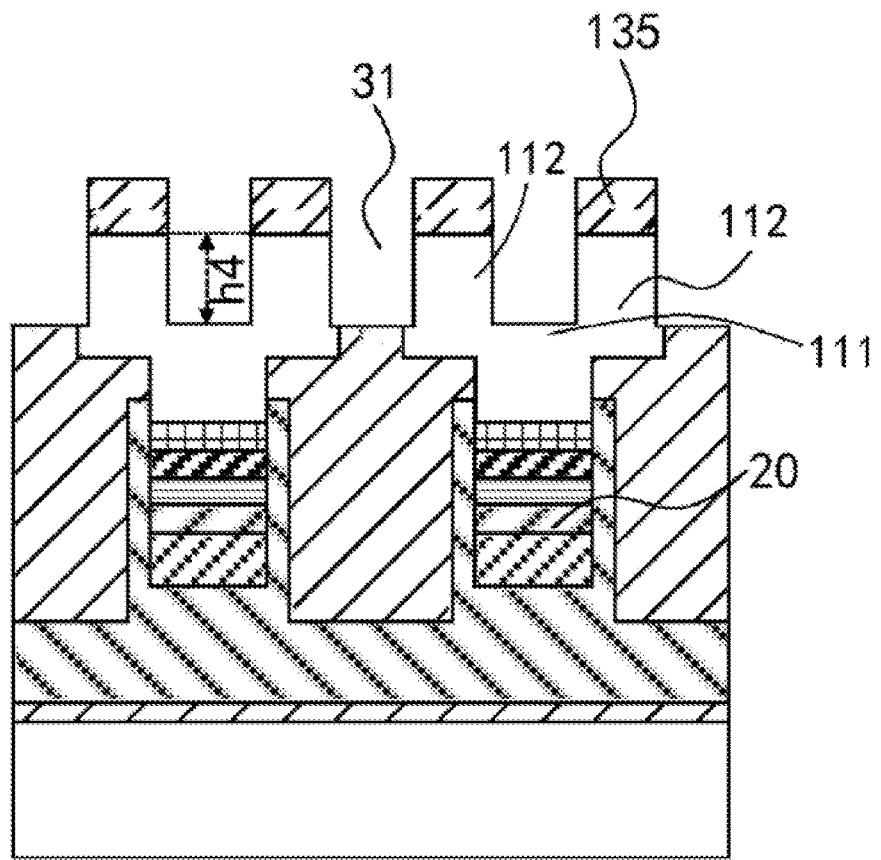
FIG. 18 is a schematic structural diagram of a section at F-F in FIG. 17.

A fourth mask layer 32 is formed on the third insulating dielectric layer 135, that is, a plurality of fourth mask layers 32 is arranged at intervals in the first direction. In this case, the fourth mask layers 32 partially overlap with a region where the word lines 30 are disposed, that is, the fourth mask layers 32 cover the region where the word lines 30 are disposed and are disposed in the middle of the region where the word lines 30 are disposed, as shown in FIG. 17. a part of the third insulating dielectric layer 135 and a part of the active material layer 26 that are not covered by the fourth mask layers 32 are removed by the etching process or the pattern transfer process to form the third opening 31, as shown in FIG. 18. In this case, a part of the active material layer 26 is disposed in the third insulating dielectric layer 135, and the top of the active material layer 26 is covered with the third insulating dielectric layer 135. Two plunger sections 112 are formed by removing the middle of the active material layer 26. Top ends of the plunger sections 112 are covered with the third insulating dielectric layer 135, and in this case, the remaining active material layer 26 serves as the final active regions 11.

In one embodiment, as shown in FIG. 18, a depth h4 of the third opening 31 ranges from 60 nm to 100 nm. The depth h4 of the third opening 31 is a height of each plunger section 112.

In one embodiment, the method for manufacturing the semiconductor structure further includes: prior to forming the word lines 30, forming a fourth insulating dielectric layer 136 in a sidewall of the third opening 31.

Figure 19:
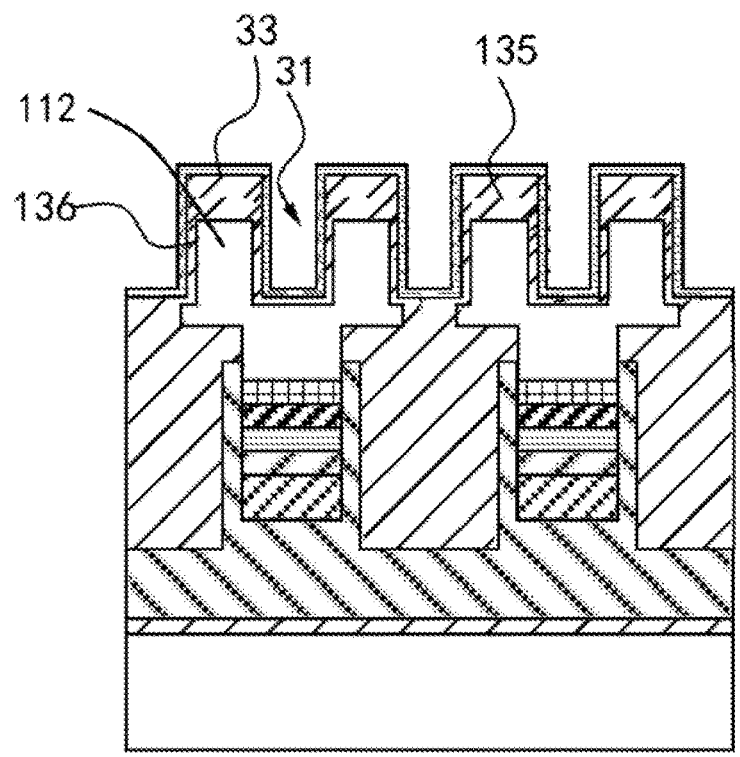
FIG. 19 is a schematic structural diagram of forming a work function layer in a method for manufacturing a semiconductor structure according to an exemplary embodiment.

In FIG. 18, a top end of each supporting section 111 and sidewalls of the plunger sections 112 are exposed, and thus covered with the fourth insulating dielectric layer 136, as shown in FIG. 19. A thickness of the fourth insulating dielectric layer 136 may range from 5 nm to 10 nm.

Specifically, the fourth insulating dielectric layer 136 may include SiO2, SiOC or other materials.

It should be noted that the fourth insulating dielectric layer 136 may be formed by using a PVD process, a CVD process, an ALD process, an in-situ steam generation (ISSG) process, or the like.

In one embodiment, forming the word lines 30 includes: forming a work function layer 33 on the fourth insulating dielectric layer 136; filling the work function layer 33 with a conductive material layer 34; and forming a fourth opening 35 in the conductive material layer 34, wherein the remaining work function layer 33 and conductive material layer 34 serve as the word lines 30.

Specifically, a material of the work function layer 33 may include tungsten silicide (WSi), titanium nitride (TiN), or the like.

A material of the conductive material layer 34 may include at least one of tungsten nitride (WN), molybdenum nitride (MoN), tantalum nitride (TaN), titanium silicon nitride (TiSiN), tantalum silicon nitride (TaSiN) or tungsten (W).

Figure 20:
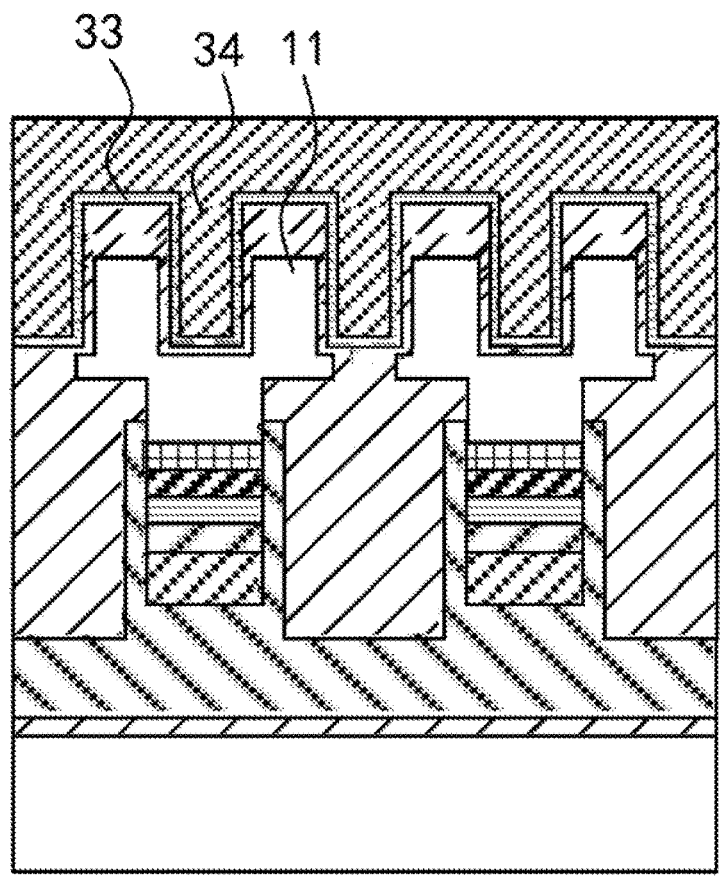
FIG. 20 is a schematic structural diagram of forming a conductive material layer in a method for manufacturing a semiconductor structure according to an exemplary embodiment.

As shown in FIG. 19, the fourth insulating dielectric layer 136 is covered with the work function layer 33, wherein a thickness of the work function layer 33 may be 2 nm to 3 nm. The work function layer 33 is filled with the conductive material layer 34, and the conductive material layer 34 completely covers the work function layer 33, as shown in FIG. 20.

A part of the work function layer 33 and a part of the conductive material layer 34 are removed by performing planarization by means of etching or chemical mechanical polishing (CMP). That is, the structure shown in FIG. 21 is formed.

It should be noted that the work function layer 33 and the conductive material layer 34 may be formed by using a PVD process, a CVD process, an ALD process, or the like.

Figure 21:
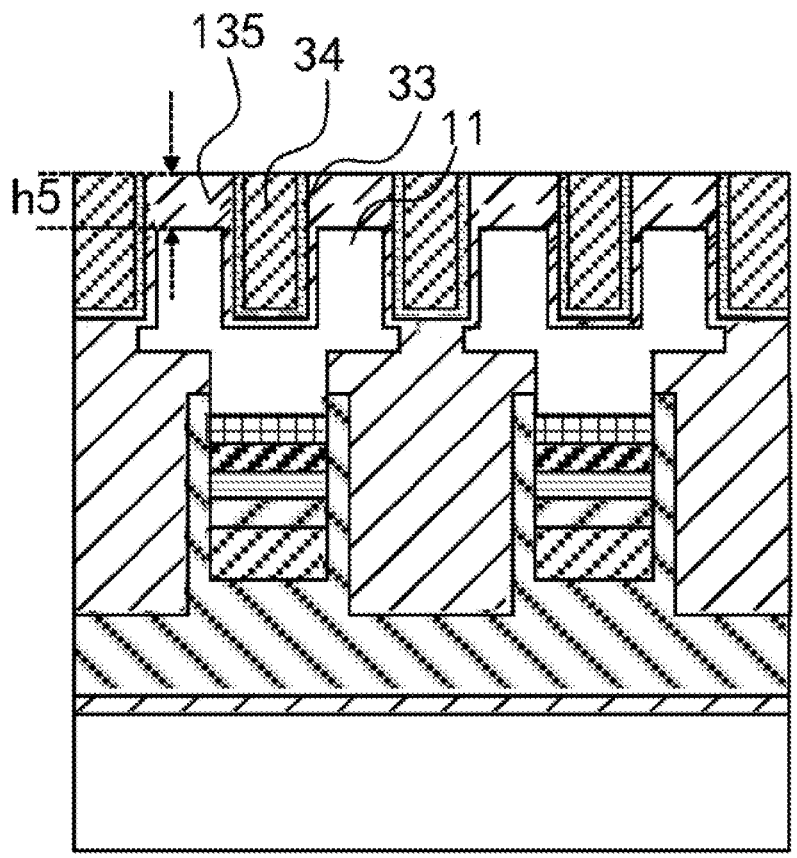
FIG. 21 is a schematic structural diagram after a part of conductive material layer is removed in a method for manufacturing a semiconductor structure according to an exemplary embodiment.

In one embodiment, as shown in FIG. 21, a thickness h5 of the third insulating dielectric layer 135 at a top end of each active region 11 range from 30 nm to 40 nm. That is, when the work function layer 33 and the conductive material layer 34 are removed, a part of the third insulating dielectric layers 135 and a part of the fourth insulating dielectric layers 136 are removed.

In one embodiment, forming the fourth opening 35 includes: forming a fifth mask layer 36 on the conductive material layer 34, wherein the fifth mask layer 36 extends in the second direction, covers a region outside a fourth preset region of the fourth opening 35, and overlaps with the word lines 30; and forming the fourth opening 35 in the fourth preset region by the etching process or the pattern transfer process.

Figure 22:
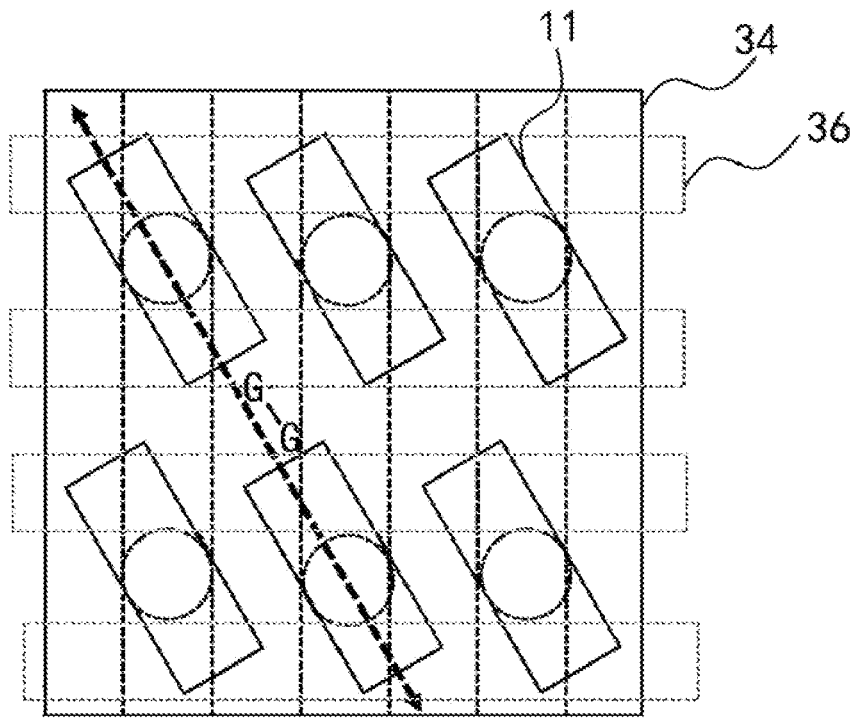
FIG. 22 is a schematic structural diagram of forming a fifth mask layer in a method for manufacturing a semiconductor structure according to an exemplary embodiment.

Based on FIG. 21, the fifth mask layer 36 shown in FIG. 22 is formed, wherein the fifth mask layer 36 covers a top end of each of the work function layer 33, the conductive material layer 34, the third insulating dielectric layer 135 and the fourth insulating dielectric layer 136. In addition, a plurality of fifth mask layers 36 is arranged at intervals in the first direction. The fifth mask layers 36 correspond to the regions where the word lines 30 are disposed one by one, and overlap with the regions where the word lines 30 are disposed. That is, after the work function layer 33 and the conductive material layer 34 that are not covered by the fifth mask layers 36 are removed by the etching process or the pattern transfer process, a plurality of word lines 30 is formed. Therefore, every two adjacent word lines 30 intersect with two plunger sections 112 in each active region 11.

In one embodiment, the method for manufacturing the semiconductor structure further includes: filling a word line isolating layer 137 in the fourth opening 35.

Specifically, the word line isolating layer 137 may include SiN, SiCN or other materials. The word line isolating layer 137 prevents the metal material included in the word lines 30 from diffusing.

It should be noted that the word line isolating layer 137 may be formed by using a PVD process, a CVD process, an ALD process, or the like.

Figure 23:
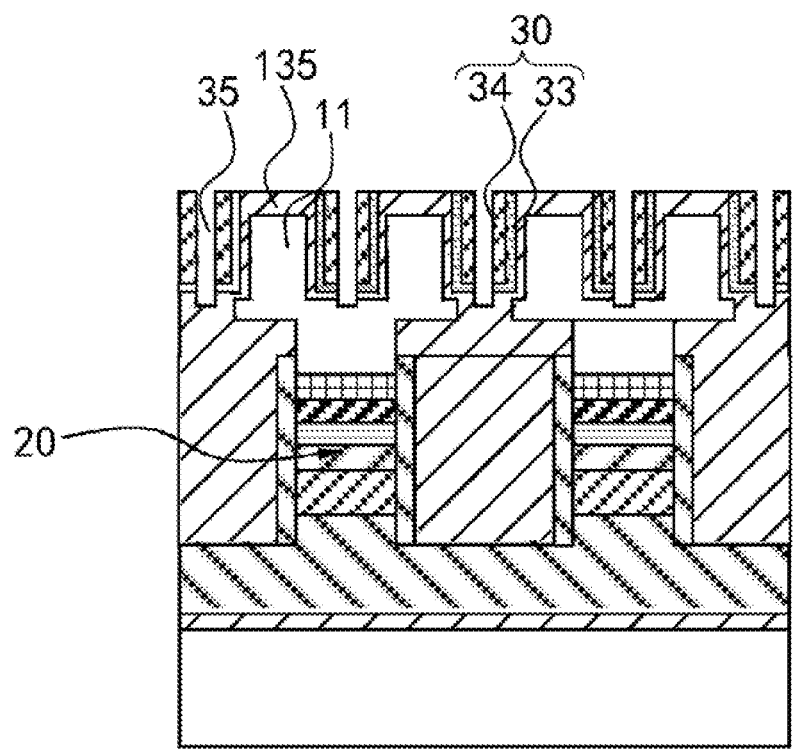
FIG. 23 is a schematic structural diagram of a section at G-G in FIG. 22.
Figure 24:
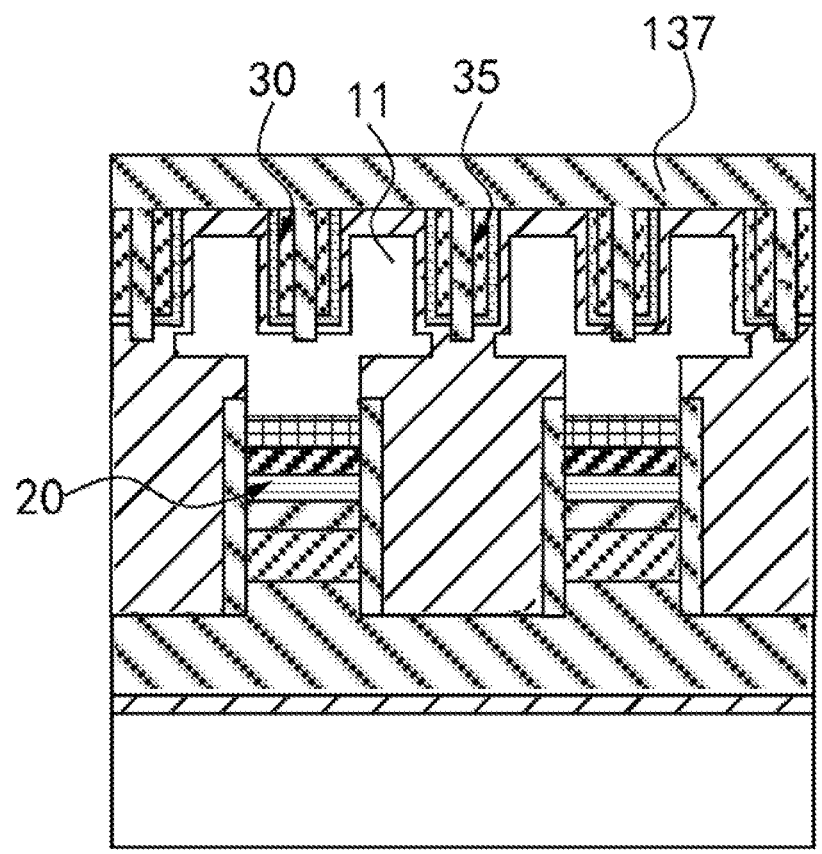
FIG. 24 is a schematic structural diagram of forming a word line isolating layer in a method for manufacturing a semiconductor structure according to an exemplary embodiment.

In one embodiment, based on FIG. 23, the word line isolating layer 137 is formed by the ALD process, wherein the word line isolating layer 137 fills the fourth opening 35 and covers a top end of each word line 30, as shown in FIG. 24. The top end of each active region 11 is exposed by performing planarization by means of etching or chemical mechanical polishing (CMP), thereby forming the semiconductor structure shown in FIGS. 25 to 28.

Figure 29:
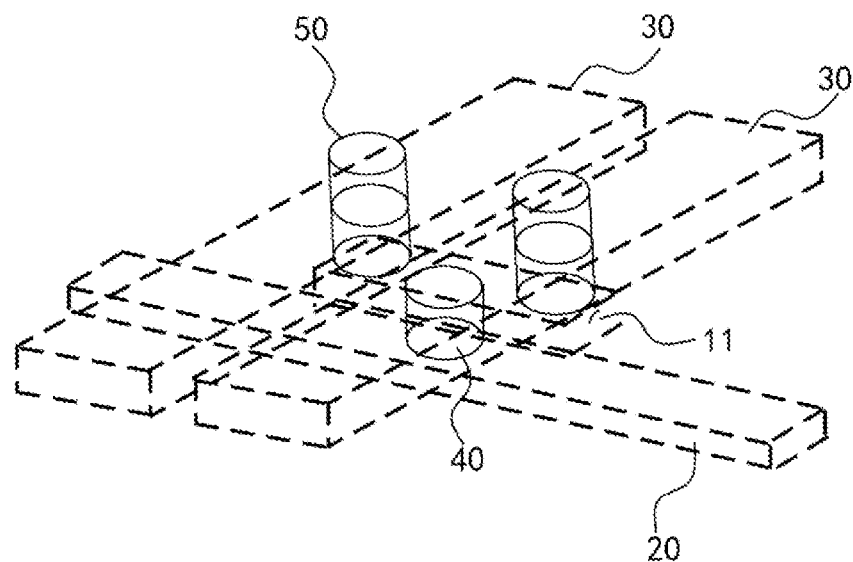
FIG. 29 is a schematic structural diagram of a semiconductor structure according to an exemplary embodiment.

In one embodiment, a capacitor 50 is installed on each active region 11 to form the semiconductor structure shown in FIG. 29.

Figure 30:
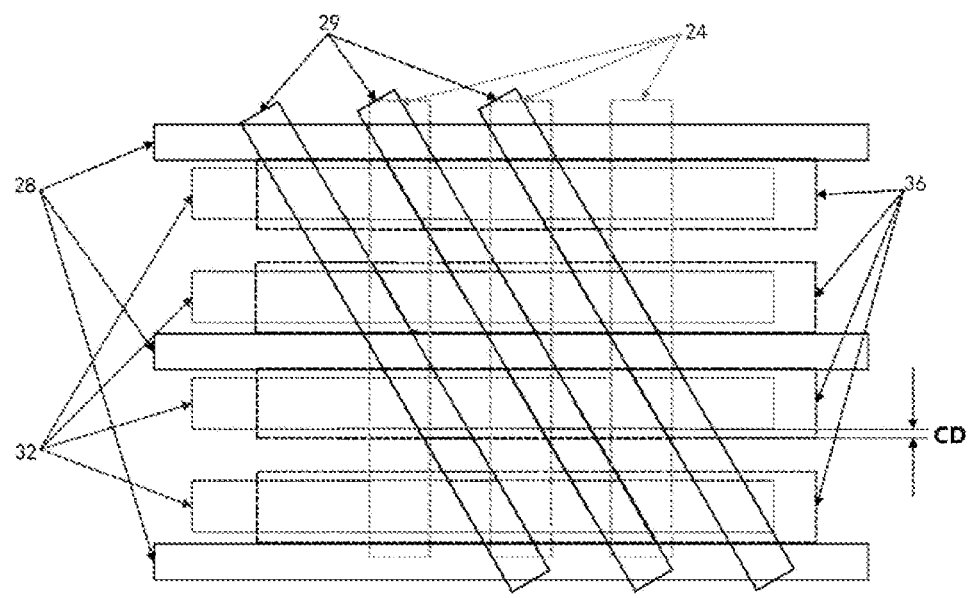
FIG. 30 is a schematic structural diagram of a distribution of a mask layer in a method for manufacturing a semiconductor structure according to an exemplary embodiment.

In one embodiment, as shown in FIG. 30, a relative position relationship of the first mask layers 24, the second mask layers 28, the third mask layers 29, the fourth mask layers 32, and the fifth mask layers 36 are described, wherein a distance CD between side edges of the fourth mask layer 32 and the fifth mask layer 36 ranges from 3 nm to 5 nm. The positions of the first mask layer 24 and the fifth mask layer 36 correspond to the bit lines 20 and the word lines 30, respectively.

Figure 25:
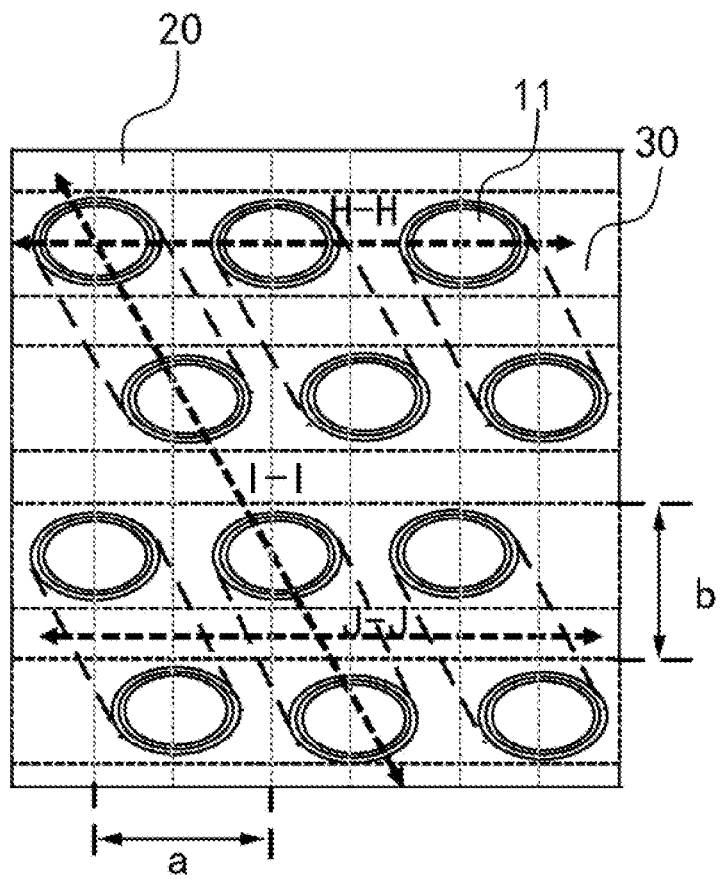
FIG. 25 is a schematic structural diagram of forming a semiconductor structure in a method for manufacturing a semiconductor structure according to an exemplary embodiment.

As shown in FIG. 25, a distance between the same sides of every two adjacent bit lines 20 is a; and a distance between the same sides of every two adjacent word lines 30 is b, $$a = \frac{2\sqrt{3}}{3}b,$$

wherein b=30 nm to 70 nm.

An embodiment of the present disclosure further provides a semiconductor structure. Referring to FIGS. 25 to 29, the semiconductor structure includes a semiconductor base 10 in which a plurality of active regions 11 is provided; bit lines 20 which are disposed in the semiconductor base 10, extend in a first direction and are connected to the active regions 11; and word lines 30 which are disposed on the semiconductor base above the bit lines 20, extend in a second direction, and intersect with the active regions 11.

The bit lines 20 of the semiconductor structure in one embodiment of the present disclosure are disposed in the semiconductor base 10 and connected to the active regions 11, while the word lines 30 are disposed on the semiconductor base 10 and intersect with the active regions 11. Therefore, a cell configuration dimension on the semiconductor base 10 is relatively small, that is, a dimension of the semiconductor structure can be further reduced. In addition, the buried bit lines 20 have a stronger control ability, so as to improve the performances of the semiconductor structure.

Figure 28:
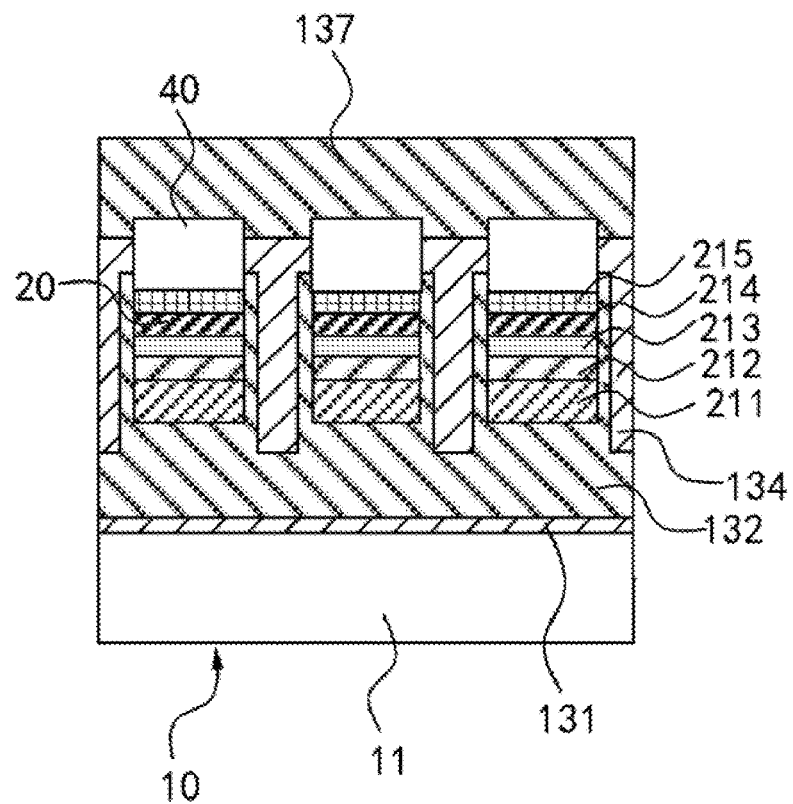
FIG. 28 is a schematic structural diagram of a section at J-J in FIG. 25.

In one embodiment, as shown in FIG. 28 and FIG. 29, the semiconductor structure further includes: a bit line contact plunger 40, two ends of which are connected to the active regions and the bit lines 20 respectively. The bit line contact plunger 40 connects each bit line 20 to the corresponding active region 11.

Specifically, the bit line contact plunger 40 may be a metal material, for example, Cu, Al, W or alloys thereof. Alternatively, the bit line contact plunger 40 may be ion-doped silicon.

Figure 27:
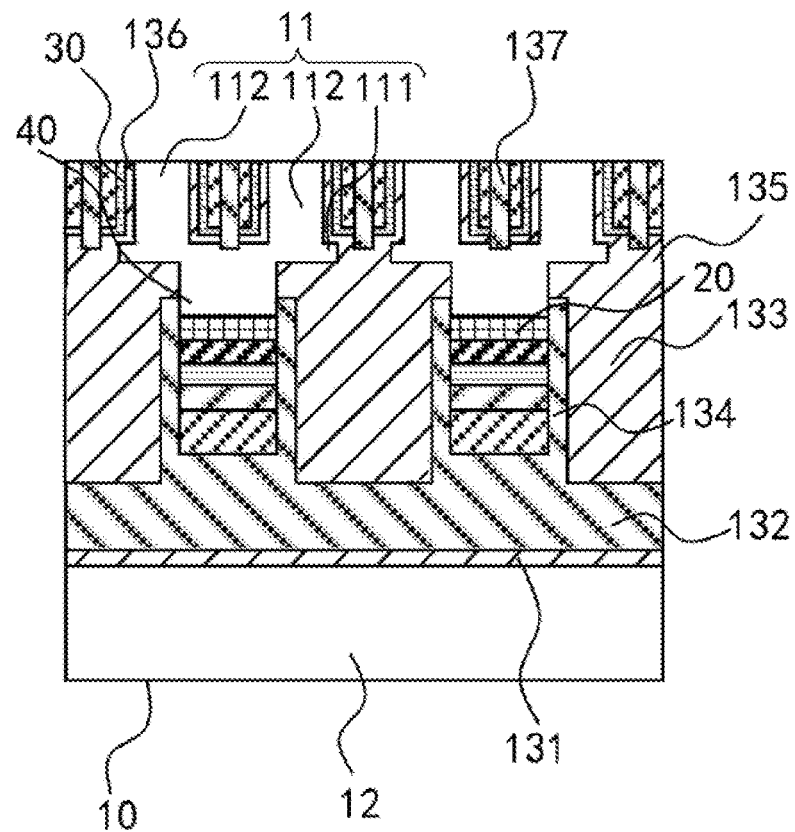
FIG. 27 is a schematic structural diagram of a section at I-I in FIG. 25.

In one embodiment, as shown in FIG. 27, a plurality of word lines 30 is provided. Each active region 11 includes: a supporting section 111, wherein a lower surface of the supporting section 111 is connected to the bit line contact plunger 40, and the supporting section extends in a third direction; and plunger sections 112, which are arranged in pairs, wherein the two plunger sections 112 in each pair are disposed on an upper surface of the supporting section 111 and intersect with two adjacent word lines 30 respectively.

Specifically, each active region 11 intersects with two adjacent word lines 30. That is, the two plunger sections 112 are inserted into the two word lines 30 respectively for being connected to two capacitors 50; and the supporting section 111 is disposed between each bit line 20 and the corresponding word line 30.

In one embodiment, the bit line contact plunger 40 is connected to the middle of the supporting section 111, and the plunger sections 112 are disposed at ends of the supporting section 111.

It should be noted that the middle here does not specifically refer to the middle position, nor does the end specifically refer to contact with the outer edge of the supporting section 111. From the overall arrangement, vertical projections of the two plunger sections 112 on a horizontal plane are respectively disposed on both sides of a vertical projection of the bit line contact plunger 40 on the horizontal plane. The vertical projection of each plunger section 112 may have an overlapping portion with the vertical projection of the bit line contact plunger 40. Of course, there may not be the overlapping region, which is not limited here.

In one embodiment, each plunger section 112 has a circular or elliptical cross section; and/or the bit line contact plunger 40 has a circular or elliptical cross section.

In one embodiment, the first direction is perpendicular to the second direction; an included angle between the third direction and the first direction is a first preset included angle; and an included angle between the third direction and the second direction is a second preset included angle, the first preset included angle and the second preset included angle are both acute angles. A plurality of bit lines 20 is arranged at intervals in the second direction, and a plurality of word lines 30 is arranged at intervals in the first direction. The active regions that intersect with two adjacent word lines 30 at the same time are arranged at intervals in the second direction.

In one embodiment, the second preset included angle may be 60 degrees.

In one embodiment, in the first direction, a width of each word line 30 is c, and a width of each plunger section 112 is d, where c−d=6 nm to 10 nm.

Specifically, a difference between the width of each word line 30 and the width of each plunger section 112 may refer to a distance CD between side edges of the fourth mask layer 32 and the fifth mask layer 36 in FIG. 30. That is, the doubled CD is the difference between the width of the word line 30 and the width of the plunger section 112.

Figure 26:
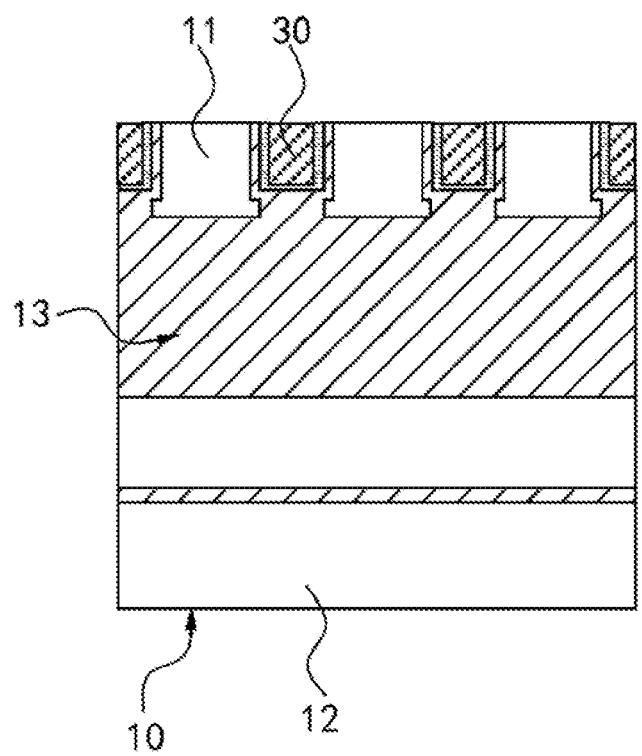
FIG. 26 is a schematic structural diagram of a section at H-H in FIG. 25.

In one embodiment, as shown in FIG. 26 and FIG. 27, the semiconductor base includes: a substrate 12; and an isolating structure 13. The isolating structure 13 is disposed above the substrate 12. The active regions 11, the bit lines 20 and the word lines 30 are all disposed inside the isolating structure 13.

Specifically, the substrate 12 may be formed of a silicon-containing material, which is not specifically limited, and may be an optional material in the related art, or may also be selected by referring to the embodiments given in the method for manufacturing the above-mentioned semiconductor structure.

The isolating structure 13 is mainly configured to be buried with the active regions 11, the bit lines 20 and the word lines 30, and to isolate the corresponding structures. The isolating structure 13 may be SiO2, SiOC, SiN, SiCN or other materials.

In one embodiment, as shown in FIG. 27 and FIG. 28, the isolating structure 13 includes a first insulating dielectric layer 131, which is disposed on the substrate 12; an isolating layer 132, which is disposed on the first insulating dielectric layer 131; and a second insulating dielectric layer 133, which is disposed on the isolating layer 132, wherein the active regions 11, the bit lines 20 and the word lines 30 are all disposed on the second insulating dielectric layer 133.

Specifically, the bit lines 20 are disposed in the second insulating dielectric layer 133, thereby forming a buried bit line 20 structure, while a part of the active regions 11 is located in the second insulating dielectric layer 133.

In one embodiment, a material of the first insulating dielectric layer 131 and a material of the second insulating dielectric layer 133 may be the same or different, and may specifically include SiO$_2$, SiOC or other materials. The isolating layer 132 may include SiN, SiCN or other materials.

In one embodiment, as shown in FIG. 27, each isolating structure 13 further includes: a bit line isolating layer 134, which is disposed between the second insulating dielectric layer 133 and the bit lines 20. The bit line isolating layer 134 is configured to prevent the metal material included in the bit lines 20 from diffusing into the second insulating dielectric layer 133.

In one embodiment, a material of the bit line isolating layer 134 and a material of the isolating layer 132 may be the same or different.

In one embodiment, as shown in FIG. 27, a plurality of word lines 30 is provided. The isolating structure 13 further includes: a word line isolating layer 137, which is disposed between every two adjacent word lines 30. The word line isolating layer 137 is configured to prevent the metal material included in the word lines 30 from diffusing.

In one embodiment, the word line isolating layer 137 may include SiN, SiCN or other materials.

In one embodiment, as shown in FIG. 27, one active region 11 intersects at two word lines 30; and bottom ends of two adjacent word line isolating layers 137 are disposed in the active regions 11 and the isolating structure 13 respectively.

As shown in FIG. 27, the isolating structure 13 further includes a third insulating dielectric layer 135, the third insulating dielectric layer 135 being buried with the supporting section 111 of each active region 11. The third insulating dielectric layer 135 is connected to the second insulating dielectric layer 133. A material of the third insulating dielectric layer 135 and a material of the second insulating dielectric layer 133 may be the same or different.

The isolating structure 13 further includes a fourth insulating dielectric layer 136, which covers the top of the supporting section 111 and the side portion of each plunger section 112. The fourth insulating dielectric layer 136 is connected to the third insulating dielectric layer 135. A material of the fourth insulating dielectric layer 136 and a material of the third insulating dielectric layer 135 may be the same or different.

It should be noted that the word line isolating layer 137 disposed between two adjacent plunger sections 112 passes through the fourth insulating dielectric layer 136 and is then disposed in the supporting section 111. The word line isolating layer 137 disposed between two adjacent active regions 11 are disposed in the fourth insulating dielectric layer 136 in a penetrating fashion, or passes through the fourth insulating dielectric layer 136 and is then disposed in the third insulating dielectric layer 135.

The isolating structure 13 is composed of the first insulating dielectric layer 131, the isolating layer 132, the second insulating dielectric layer 133, the bit line isolating layer 134, the third insulating dielectric layer 135, the fourth insulating dielectric layer 136, and the word line isolating layer 137, thereby forming a barrier to metal materials and insulation between conductive components. The semiconductor base 10 is composed of the substrate 12 and the isolating structure 13, and covers the active regions 11, the bit lines 20 and the word lines 30.

In one embodiment, as shown in FIG. 25, a plurality of bit lines 20 and a plurality of word lines 30 are provided, wherein a distance between the same sides of every two adjacent bit lines 20 is a; and a distance between the same sides of every two adjacent word lines 30 is b, $$a = \frac{2\sqrt{3}}{3}b.$$

In some embodiments, b=30 nm to 70 nm.

In one embodiment, a vertical storage transistor is formed in an overlapping region where the bit line 20 and the word line 30 intersect spatially. The vertical storage transistor is disposed on the bit line 20 and connected to the bit line 20. One overlapping region corresponds to one vertical storage transistor. A cell configuration dimension of the vertical storage transistor on the semiconductor base is greater than or equal to 4 times the square of a minimum feature dimension.

In one embodiment, a vertical storage transistor is formed in an overlapping region where the bit line 20 and the word line 30 intersect spatially. The vertical storage transistor is disposed on the bit line 20 and connected to the bit line 20. A width dimension D1 of one vertical memory transistor in a direction perpendicular to the bit lines 20 is two times of the minimum feature dimension, and a width dimension D2 thereof in a direction perpendicular to the word lines 30 is two times of the minimum feature dimension.

It should be noted that the bit lines 20 and the word lines 30 are formed with a minimum feature dimension F, and a line spacing between every two adjacent bit lines 20 and a line spacing between every two adjacent word lines 30 are also greater than or equal to the minimum feature dimension F, respectively, such that a width dimension of one vertical memory transistor in a direction perpendicular to the bit lines is 2F, and a width dimension in a direction perpendicular to the word lines is also 2F. Therefore, the cell configuration dimension of the vertical memory transistor can be correspondingly increased to 4F2 (2F*2F, that is, a 2×2 buried bit line structure). That is, the cell configuration dimension of the vertical memory transistor is greater than or equal to 4 times the square of the minimum feature dimension. Compared with the 3×2 buried word line structure, the 2×2 buried bit line structure has a smaller cell configuration dimension, that is, the packing density is higher.

In one embodiment, the semiconductor structure may be manufactured by using the above-mentioned method for manufacturing the same.

It should be noted that the specific materials of the above-mentioned semiconductor structure may be selected by referring to the materials given in the method for manufacturing the semiconductor structure, which is not repeated here.

What is claimed is:

1. A semiconductor structure, comprising:
a semiconductor base, comprising a substrate and an isolating structure disposed on the substrate;
bit lines, which are disposed in the semiconductor base and extend in a first direction; and
word lines, which are disposed on the semiconductor base above the bit lines and extend in a second direction;
wherein a plurality of active regions, the bit lines and the word lines are disposed in the isolating structure, the bit lines are connected to the active regions, and the word lines intersect with the active regions.

2. The semiconductor structure according to claim 1, wherein each of the active regions comprises:

a supporting section, wherein a lower surface of the supporting section is connected to the bit lines, and the supporting section extends in a third direction; and
plunger sections, which are arranged in pairs, wherein the two plunger sections in each of the pairs are disposed on an upper surface of the supporting section and intersect with two adjacent word lines of the word lines respectively.

3. The semiconductor structure according to claim 2, further comprising:
a bit line contact plunger, two ends of which are connected to the supporting section and the bit lines respectively, wherein
the bit line contact plunger is connected to a middle of the supporting section, and the plunger sections are disposed at ends of the supporting section.

4. The semiconductor structure according to claim 3, wherein at least one of:
each of the plunger sections has a circular or elliptical cross section; or
the bit line contact plunger has a circular or elliptical cross section.

5. The semiconductor structure according to claim 1, wherein the isolating structure comprises:
a first insulating dielectric layer, which is disposed on the substrate;
an isolating layer, which is disposed on the first insulating dielectric layer; and
a second insulating dielectric layer, which is disposed on the isolating layer, wherein the active regions, the bit lines and the word lines are all disposed on the second insulating dielectric layer.

6. The semiconductor structure according to claim 5, wherein the isolating structure further comprises:
a bit line isolating layer, which is disposed between the second insulating dielectric layer and the bit lines; and
a word line isolating layer, which is disposed between every two adjacent word lines of the word lines.

7. The semiconductor structure according to claim 6, wherein one active region of the active regions intersects with two of the word lines; and bottom ends of two adjacent word line isolating layers are disposed in the one active region and the isolating structure respectively.

8. The semiconductor structure according to claim 1, wherein
a distance between the same sides of every two adjacent bit lines of the bit lines is a; and a distance between the same sides of every two adjacent word lines of the word lines is b, $$a = \frac{2\sqrt{3}}{3}b.$$

9. The semiconductor structure according to claim 1, wherein a vertical storage transistor is formed in an overlapping region where one of the bit lines and one of the word lines intersect spatially; the vertical storage transistor is disposed on the one of the bit lines and connected to the one of the bit lines; one overlapping region corresponds to one vertical storage transistor; and a cell configuration dimension of the vertical storage transistor on the semiconductor base is greater than or equal to 4 times a square of a minimum feature dimension.

* * * * *